United States Patent
Lenart et al.

(10) Patent No.: US 11,171,249 B2
(45) Date of Patent: Nov. 9, 2021

(54) WAFER-LEVEL METHODS FOR MANUFACTURING UNIFORM LAYERS OF MATERIAL ON OPTOELECTRONIC MODULES

(71) Applicant: ams Sensors Singapore Pte. Ltd, Singapore (SG)

(72) Inventors: Robert Lenart, Singapore (SG); Sonja Gantner-Hanselmann, Lachen (CH); Özkan Ahishali, Singapore (SG)

(73) Assignee: ams Sensors Singapore Pte. Ltd., Singapore (SG)

( * ) Notice: Subject to any disclaimer, the term of this patent is extended or adjusted under 35 U.S.C. 154(b) by 5 days.

(21) Appl. No.: 16/630,588

(22) PCT Filed: Jul. 24, 2018

(86) PCT No.: PCT/SG2018/050364
§ 371 (c)(1),
(2) Date: Jan. 13, 2020

(87) PCT Pub. No.: WO2019/022664
PCT Pub. Date: Jan. 31, 2019

(65) Prior Publication Data
US 2020/0176615 A1 Jun. 4, 2020

Related U.S. Application Data

(60) Provisional application No. 62/536,738, filed on Jul. 25, 2017.

(51) Int. Cl.
*H01L 31/0203* (2014.01)
*B29C 45/14* (2006.01)
(Continued)

(52) U.S. Cl.
CPC .... *H01L 31/0203* (2013.01); *B29C 45/14655* (2013.01); *H01L 21/565* (2013.01);
(Continued)

(58) Field of Classification Search
CPC ............ H01L 31/0203; H01L 31/1876; H01L 31/1892; B29C 45/14655; B29L 2031/3406
See application file for complete search history.

(56) References Cited

U.S. PATENT DOCUMENTS

| 5,866,952 A | * | 2/1999 | Wojnarowski | .......... H01L 24/75 257/788 |
| 2009/0097139 A1 | * | 4/2009 | Minamio | .......... H01L 27/14618 359/811 |

(Continued)

FOREIGN PATENT DOCUMENTS

| CN | 101859809 A | 10/2010 |
| WO | 98/53923 A1 | 12/1998 |
| WO | 2015038064 A2 | 3/2015 |

OTHER PUBLICATIONS

International Search Report for corresponding International Application No. PCT/SG2018/050364 dated Jul. 24, 2018.
(Continued)

*Primary Examiner* — Earl N Taylor
(74) *Attorney, Agent, or Firm* — Michael Best and Friedrich LLP (57) ABSTRACT

Wafer-level methods for manufacturing one or more uniform layers of material on one or more surfaces of a plurality of optoelectronic modules include assembling a wafer assembly, injecting a formable material into the wafer assembly, ejecting excess formable material form the wafer assembly, and hardening one or more formable material layers on one or more surfaces of the plurality of optoelec-
(Continued)

tronic modules such that the hardened one or more formable material layers are the one or more uniform layers of material.

13 Claims, 14 Drawing Sheets

(51) Int. Cl.
 *H01L 31/18* (2006.01)
 *H01L 21/56* (2006.01)
 *B29K 63/00* (2006.01)
 *B29L 31/34* (2006.01)

(52) U.S. Cl.
 CPC ........ *H01L 21/566* (2013.01); *H01L 31/1876* (2013.01); *H01L 31/1892* (2013.01); *B29K 2063/00* (2013.01); *B29L 2031/3406* (2013.01); *H01L 2933/005* (2013.01); *H01L 2933/0025* (2013.01)

(56) References Cited

U.S. PATENT DOCUMENTS

| | | | |
|---|---|---|---|
| 2013/0187174 A1* | 7/2013 | Tischler | H01L 27/14 257/80 |
| 2013/0187178 A1* | 7/2013 | Tischler | H01L 24/96 257/88 |
| 2015/0034975 A1* | 2/2015 | Rudmann | H01L 27/14687 257/82 |
| 2016/0163884 A1* | 6/2016 | Sorrieul | H01L 23/3135 257/434 |
| 2020/0176615 A1* | 6/2020 | Lenart | H01L 31/0216 |

OTHER PUBLICATIONS

Extended Search Report issued from The European Patent Office for related Application No. 18837192.6 dated Mar. 31, 2021 (7 Pages).

* cited by examiner

102: Wafer assembly
104: Module wafer
106: Optoelectronic module
108: Tool wafer
110: Chuck
112: Gas-tight mounting frame
114: Gasket
116: Quick-release foils
118: Quick-release protrusions
120: Quick-release substrate
122: Transmissive portions
124: Formable material
126: Vacuum
128: Rotation
130: Pressurized gas
132: Hot/reactive pressurized gas
134: Port
136: Cavities
138: Non-transmissive portions
140: Hardening station substrate
142: Formable material layer
144: Formable material layer on module
146: Formable material layer tails
148: Fully hardened formable material layer on module
150: Partially hardened formable material layer
152: Partially hardened formable material layer on module
154: Partially hardened formable material layer tails
160: Radiation
196: Hardening station assembly 156: First formable material
158: Second formable material
162: First formable material layer
164: First formable material layer on module
166: First formable material layer tails
168: Fully hardened first formable material layer on module
170: Partially hardened first formable material layer
172: Partially hardened first formable material layer on module
174: Partially hardened first formable material layer tails 182: Second formable material layer
184: Second formable material layer on module
186: Second formable material layer tails
188: Fully hardened second formable material layer on module
190: Partially hardened second formable material layer
192: Partially hardened second formable material layer on module
194: Partially hardened second formable material layer tails

156: First formable material
158: Second formable material
162: First formable material layer
164: First formable material layer on module
166: First formable material layer tails
168: Fully hardened first formable material layer on module
170: Partially hardened first formable material layer
172: Partially hardened first formable material layer on module
174: Partially hardened first formable material layer tails 182: Second formable material layer
184: Second formable material layer on module
186: Second formable material layer tails
188: Fully hardened second formable material layer on module
190: Partially hardened second formable material layer
192: Partially hardened second formable material layer on module
194: Partially hardened second formable material layer tails

156: First formable material
158: Second formable material
162: First formable material layer
164: First formable material layer on module
166: First formable material layer tails
168: Fully hardened first formable material layer on module
170: Partially hardened first formable material layer
172: Partially hardened first formable material layer on module
174: Partially hardened first formable material layer tails
182: Second formable material layer
184: Second formable material layer on module
186: Second formable material layer tails
188: Fully hardened second formable material layer on module
190: Partially hardened second formable material layer
192: Partially hardened second formable material layer on module
194: Partially hardened second formable material layer tails 156: First formable material
158: Second formable material
162: First formable material layer
164: First formable material layer on module
166: First formable material layer tails
168: Fully hardened first formable material layer on module
170: Partially hardened first formable material layer
172: Partially hardened first formable material layer on module
174: Partially hardened first formable material layer tails 182: Second formable material layer
184: Second formable material layer on module
186: Second formable material layer tails
188: Fully hardened second formable material layer on module
190: Partially hardened second formable material layer
192: Partially hardened second formable material layer on module
194: Partially hardened second formable material layer tails

156: First formable material
158: Second formable material
162: First formable material layer
164: First formable material layer on module
166: First formable material layer tails
168: Fully hardened first formable material layer on module
170: Partially hardened first formable material layer
172: Partially hardened first formable material layer on module
174: Partially hardened first formable material layer tails 182: Second formable material layer
184: Second formable material layer on module
186: Second formable material layer tails
188: Fully hardened second formable material layer on module
190: Partially hardened second formable material layer
192: Partially hardened second formable material layer on module
194: Partially hardened second formable material layer tails

WAFER-LEVEL METHODS FOR MANUFACTURING UNIFORM LAYERS OF MATERIAL ON OPTOELECTRONIC MODULES

CROSS REFERENCE TO RELATED APPLICATIONS

This patent application is the U.S. national stage entry, under 35 U.S.C. § 371, of International Application No. PCT/SG2018/050364, filed Jul. 24, 2018, which claims priority to U.S. Provisional Patent Application No. 62/536,738 filed Jul. 25, 2017, the entire contents of which are hereby incorporated by reference.

FIELD OF THE DISCLOSURE

This disclosure relates to wafer-level methods of manufacturing.

SUMMARY

This disclosure describes wafer-level methods for manufacturing one or more uniform layers of material on one or more surfaces of a plurality of optoelectronic modules. In one aspect, for example, the methods include assembling a wafer assembly, where the wafer assembly includes a chuck, a tool wafer, and a module wafer. The module wafer includes the plurality of optoelectronic modules. The method further includes injecting a formable material into the wafer assembly such that one or more surfaces of the plurality of optoelectronic module are coated with a formable material layer. The method further includes ejecting excess formable material from the wafer assembly, and further includes hardening the formable material layer.

In some implementations, the wafer-level method includes a wafer assembly with a plurality of quick-release foils, a plurality of quick-release protrusions, a quick-release substrate, transmissive portions, or any combination of the aforementioned.

In some implementations, injecting a formable material into the wafer assembly further includes applying a vacuum to the wafer assembly and/or rotating the wafer assembly.

In some implementations, ejecting excess formable material from the wafer assembly includes applying a vacuum and/or pressurized gas to the wafer assembly and/or rotating the wafer assembly.

In some implementations, hardening the formable material layer includes hardening the formable material with reactive pressurized gas, hot pressurized gas, reactive and hot pressurized gas, radiation, or any combination of the aforementioned.

Other aspects, features, and advantages will be apparent from the following detailed description, the accompanying drawings, and the claims.

DETAILED DESCRIPTION

Figure 1:
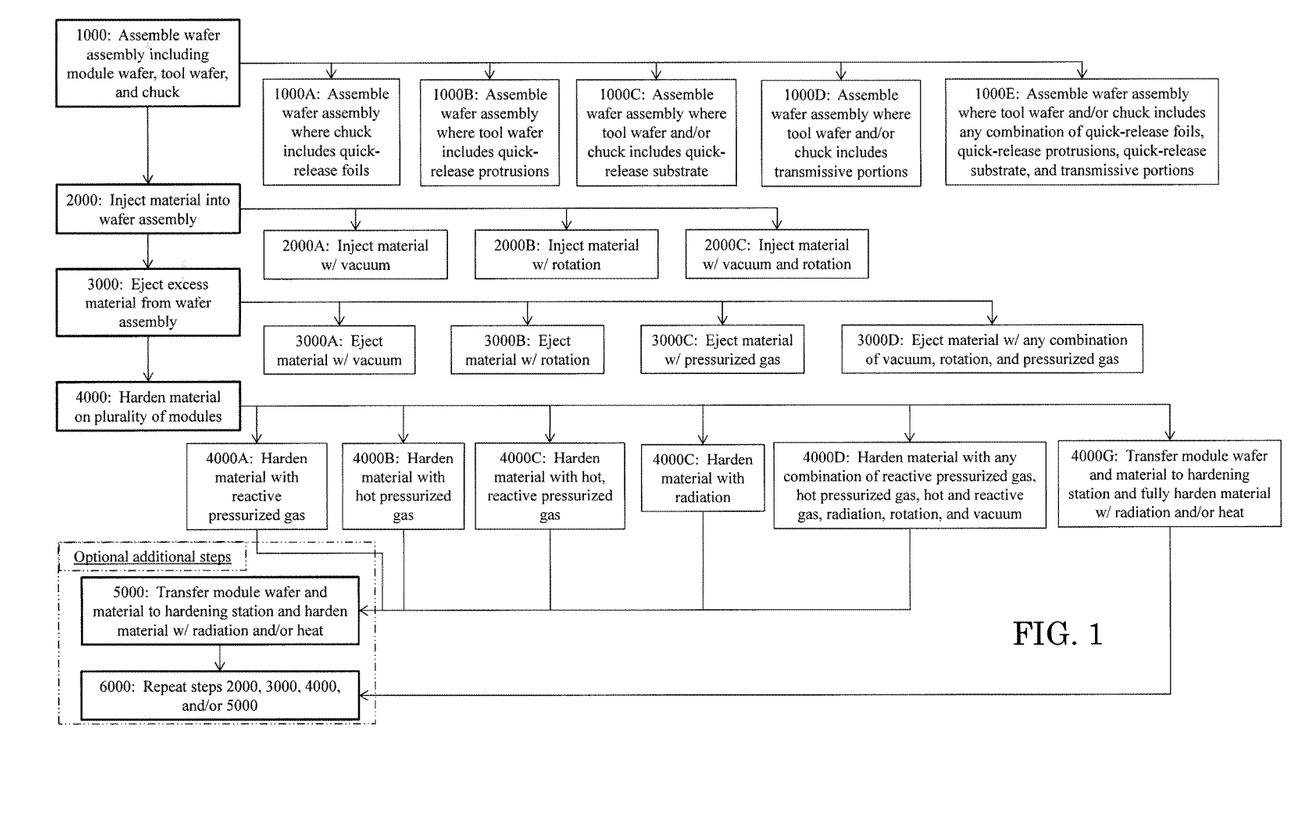
FIG. 1 depicts a wafer-level method for manufacturing uniform layers of material on one or more surfaces of a plurality of optoelectronic modules.
Figure 2A:
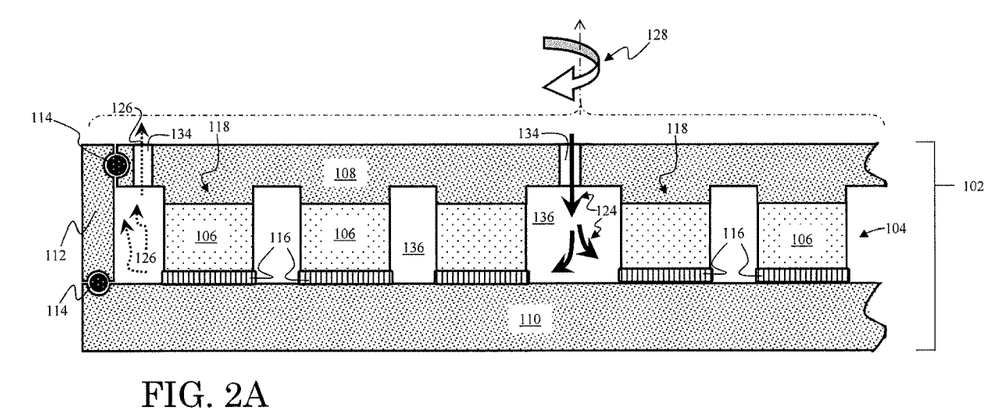
FIGS. 2A-2E depict an example wafer-level method for manufacturing uniform layers of material on one or more surfaces of a plurality of optoelectronic modules.
Figure 2B:
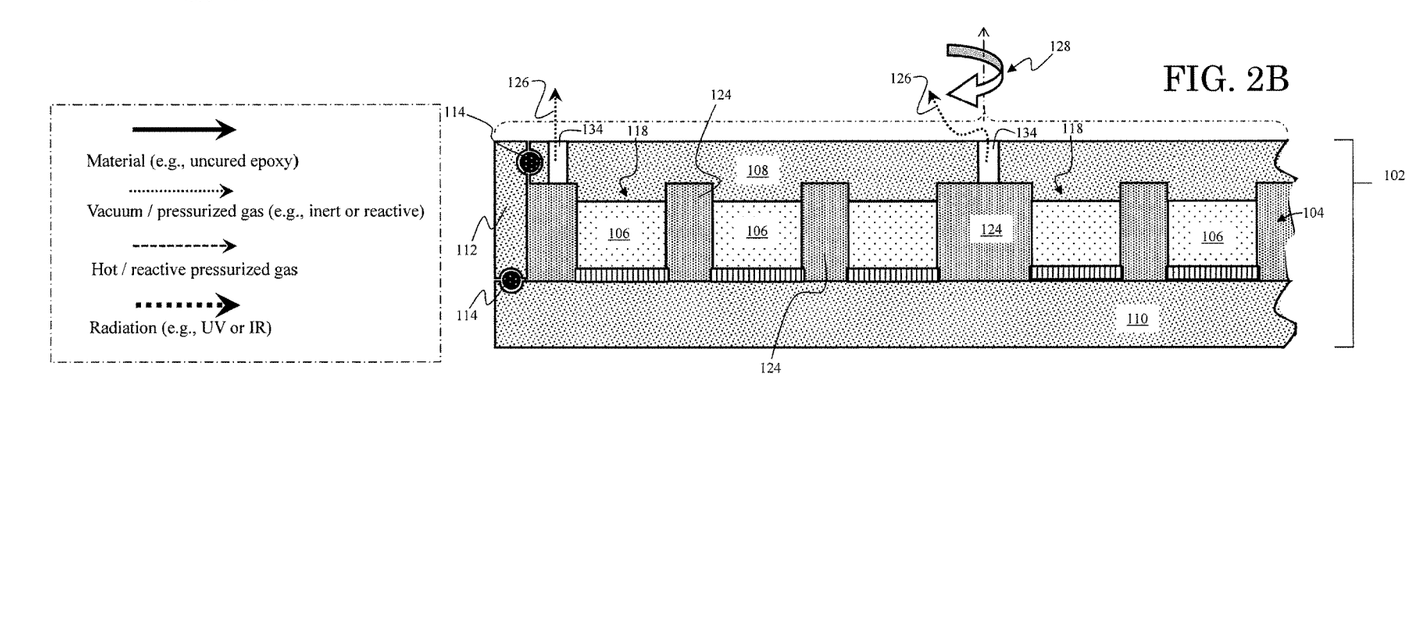
Figure 2C:
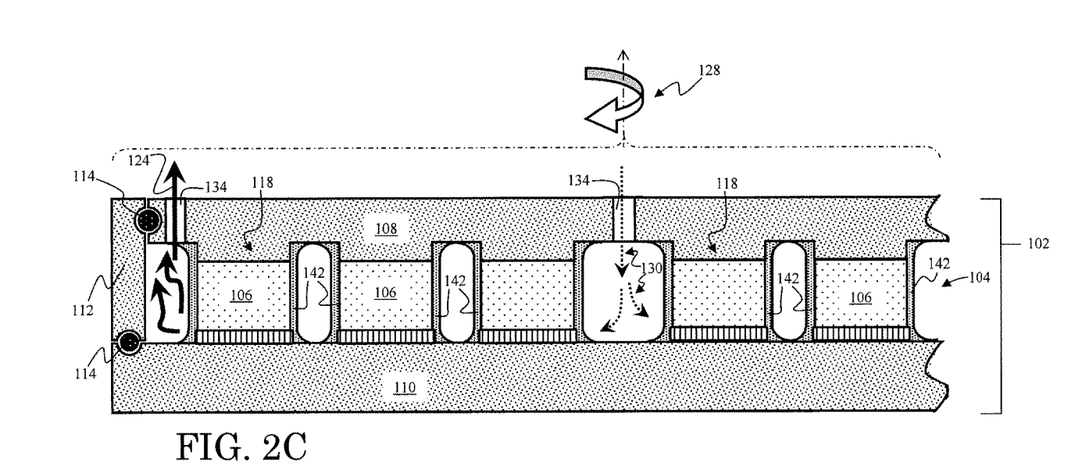
Figure 2D:
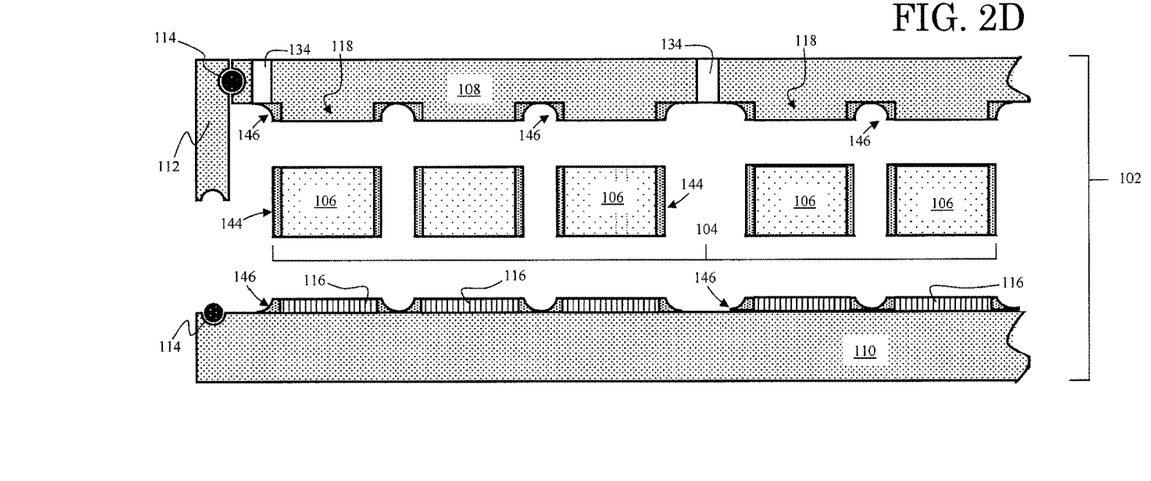
Figure 2E:
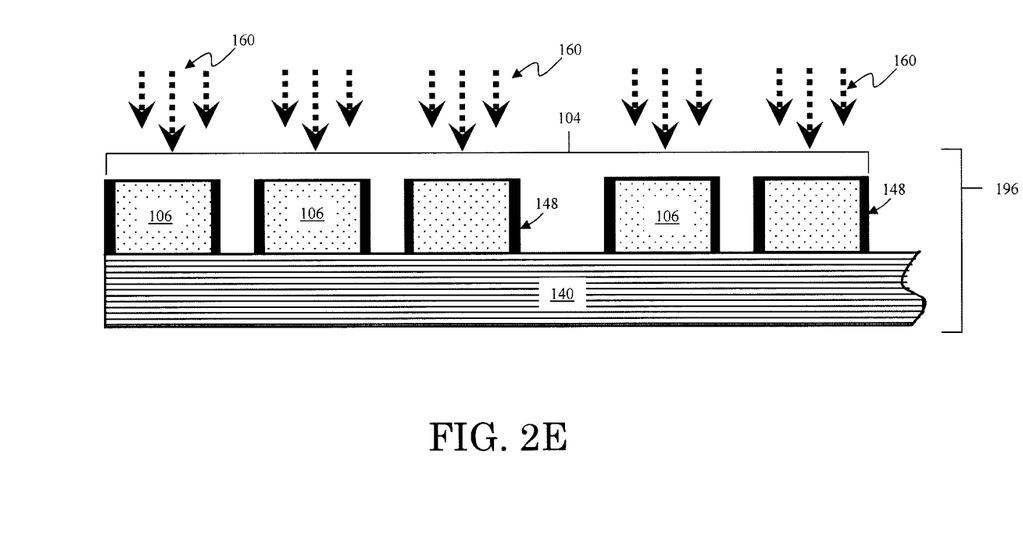
Figure 3A:
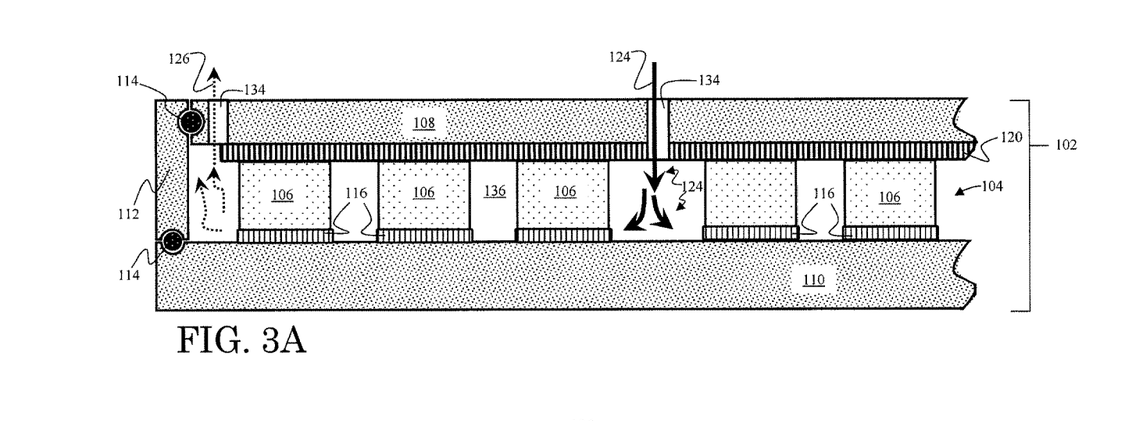
FIGS. 3A-3F depict another example wafer-level method for manufacturing uniform layers of material on one or more surfaces of a plurality of optoelectronic modules.
Figure 3B:
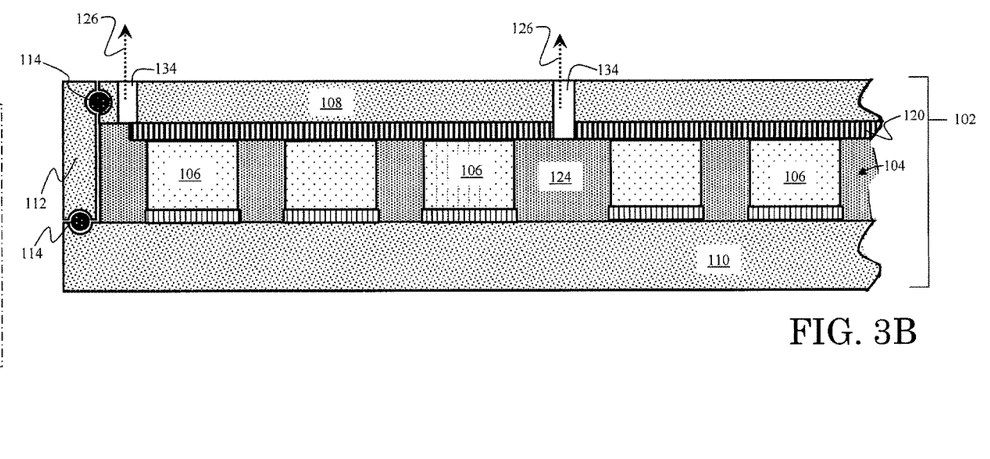
Figure 3C:
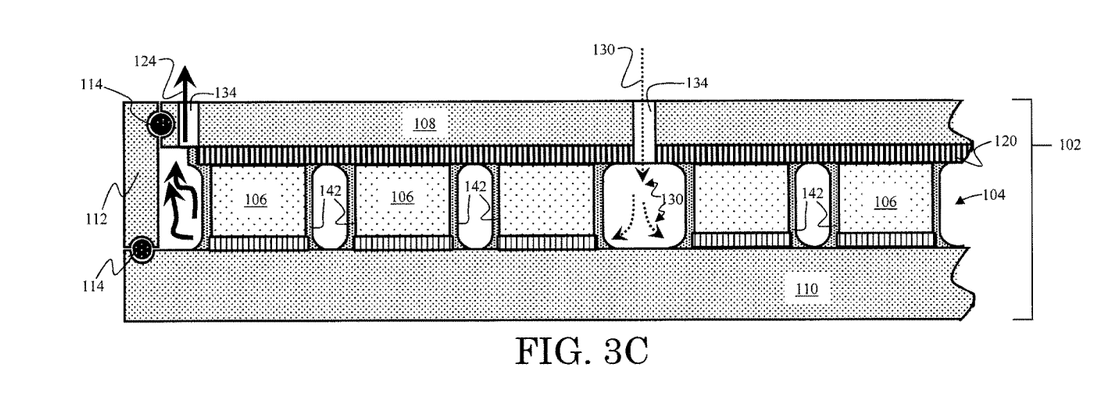
Figure 3D:
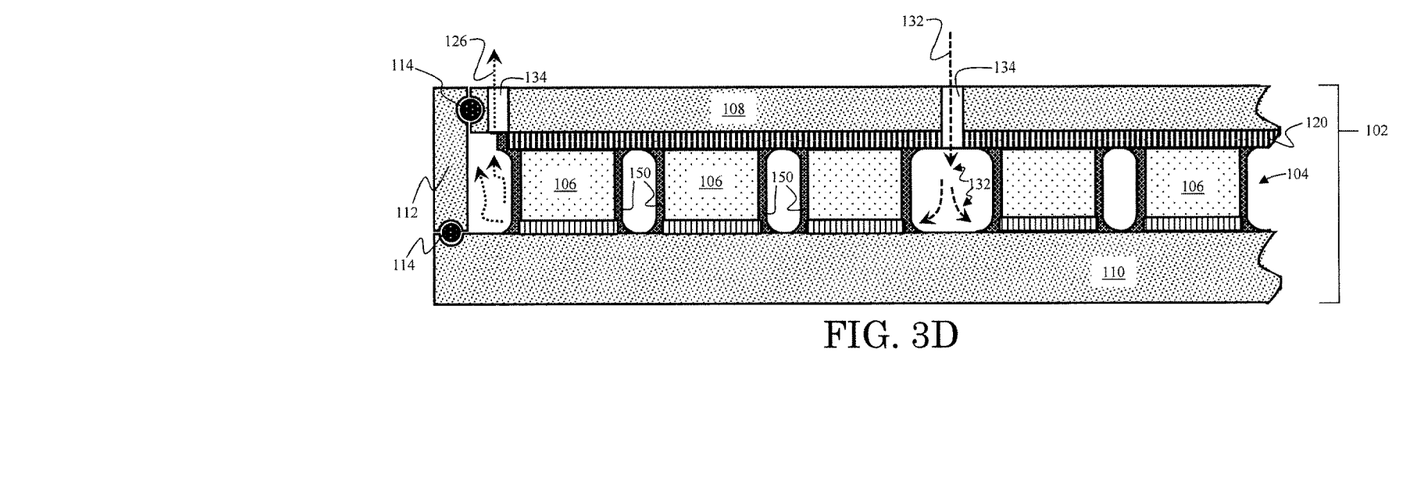
Figures 3E, 3F:
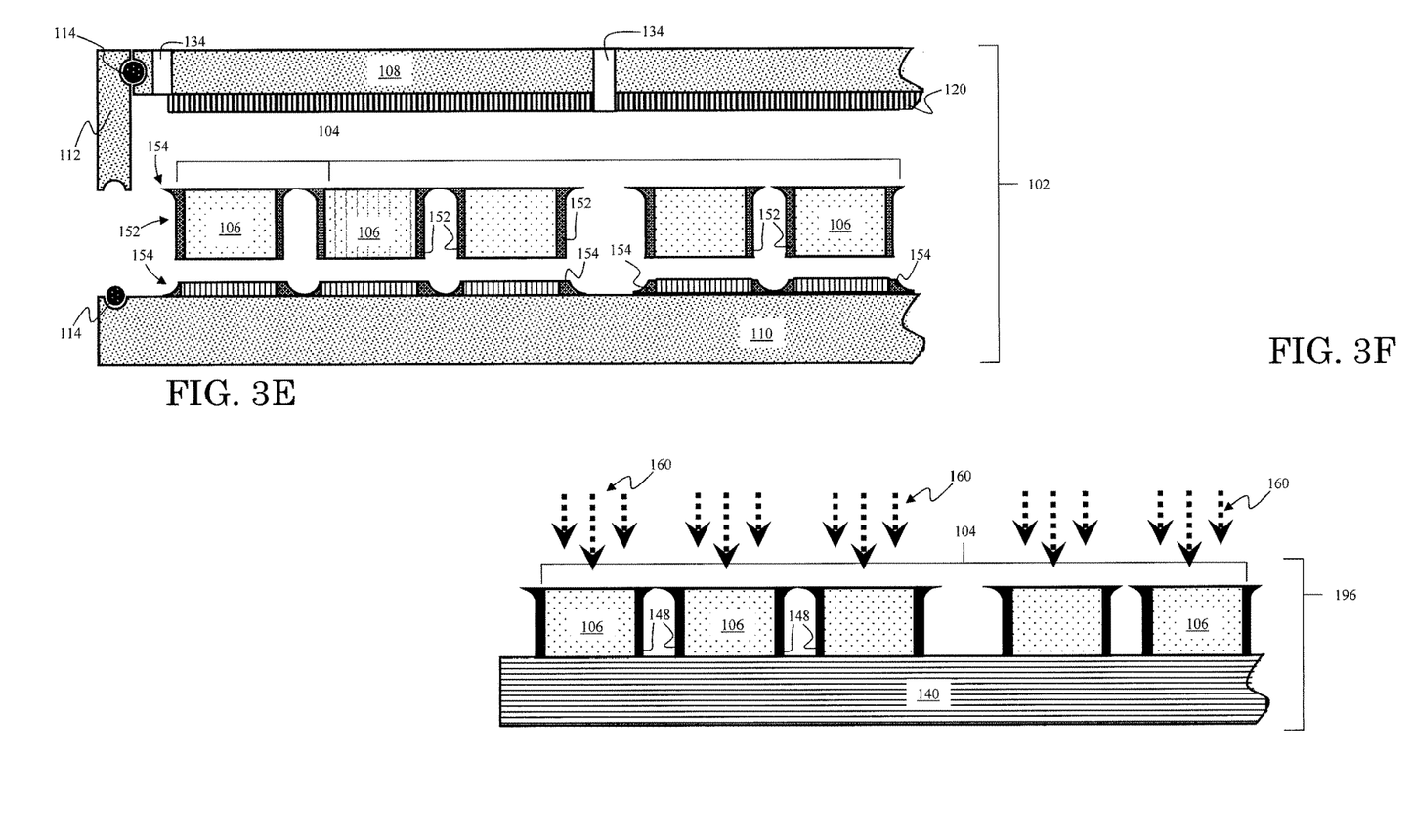
Figure 4A:
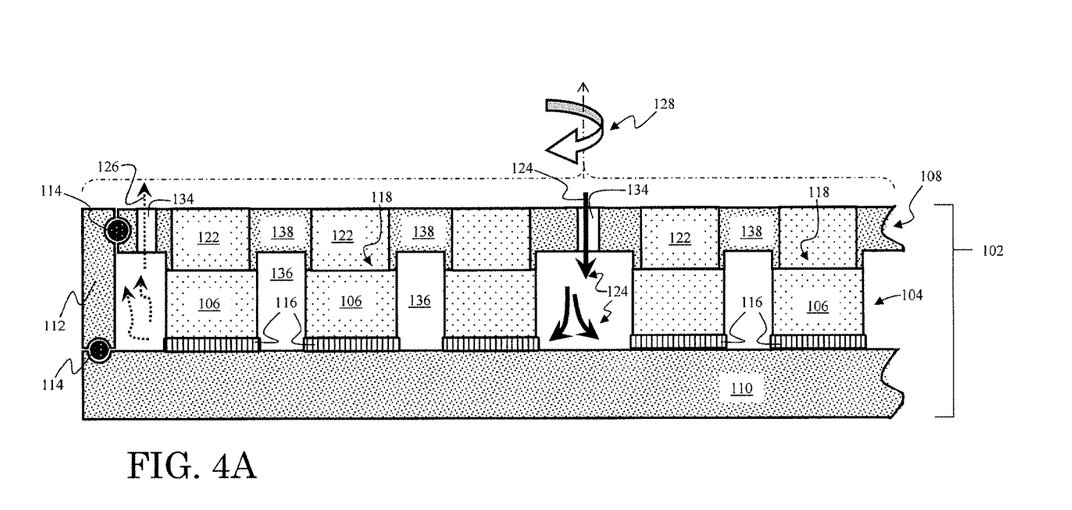
FIGS. 4A-4D depict still another example wafer-level method for manufacturing uniform layers of material on one or more surfaces of a plurality of optoelectronic modules.
Figure 4B:
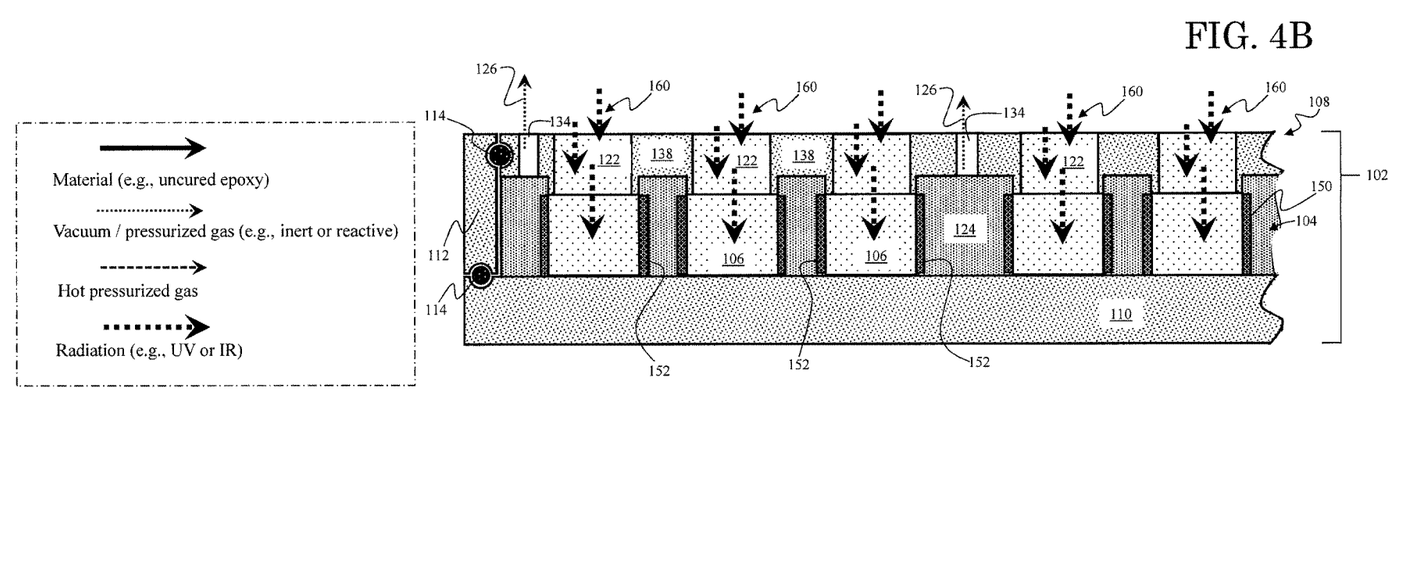
Figure 4C:
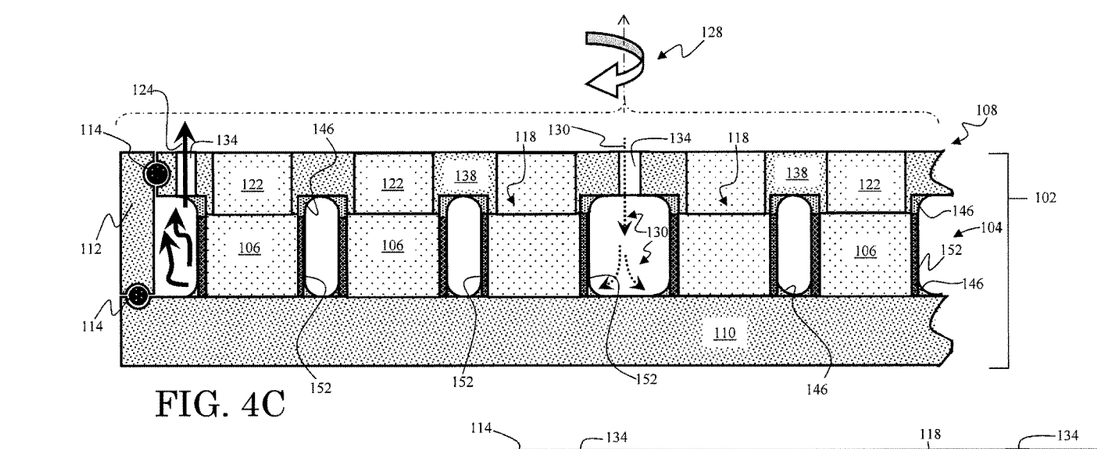
Figure 4D:
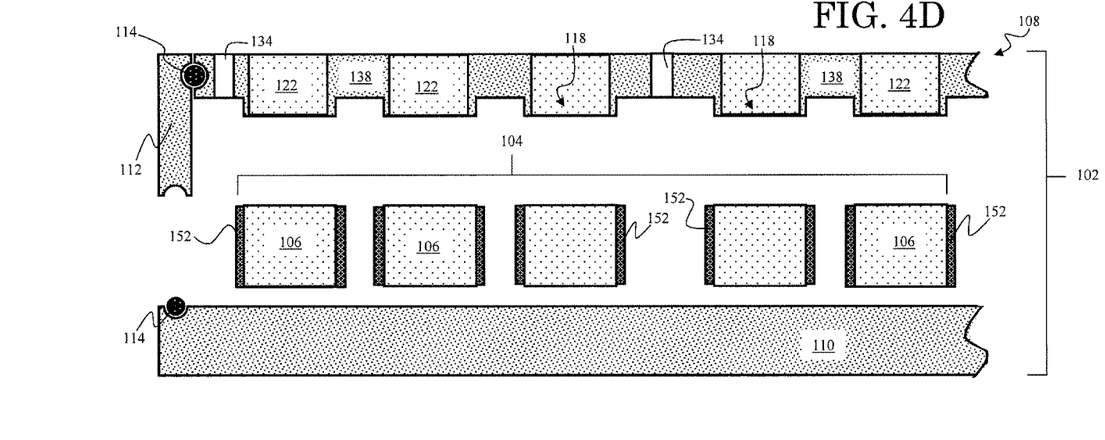
Figure 5A:
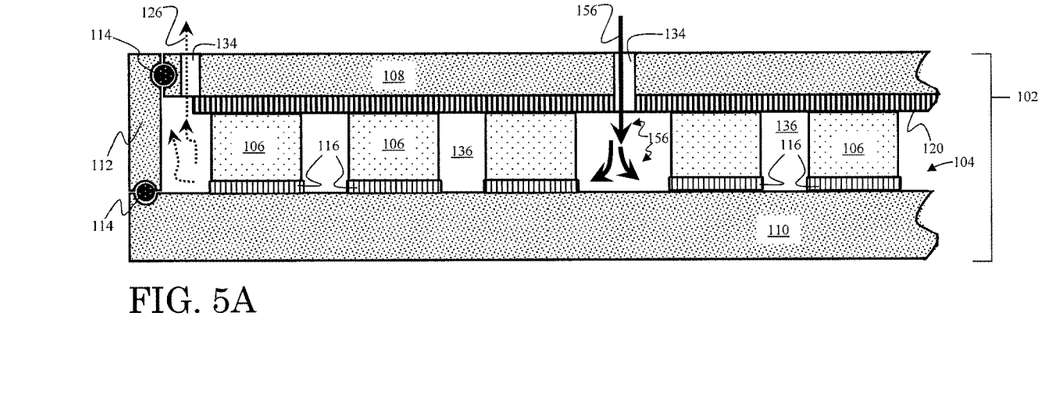
FIGS. 5A-5J depict yet another example wafer-level method for manufacturing uniform layers of material on one or more surfaces of a plurality of optoelectronic modules.
Figure 5B:
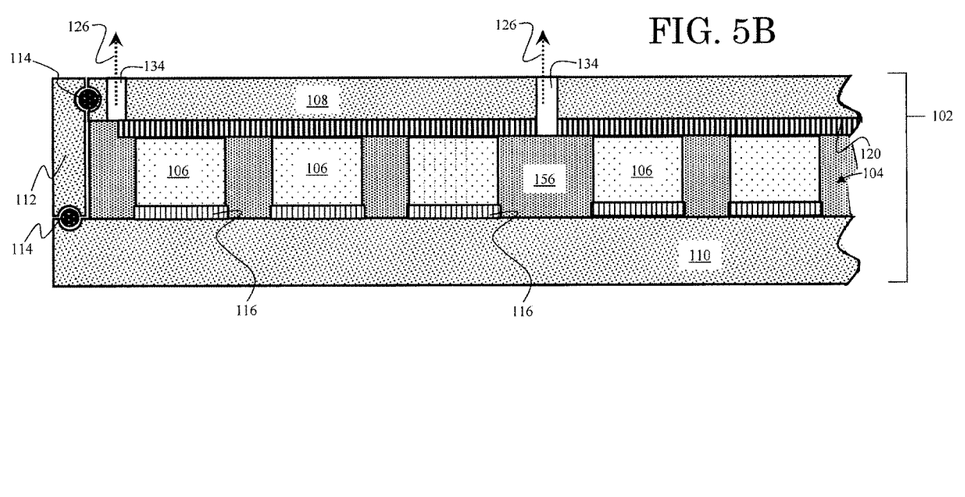
Figure 5C:
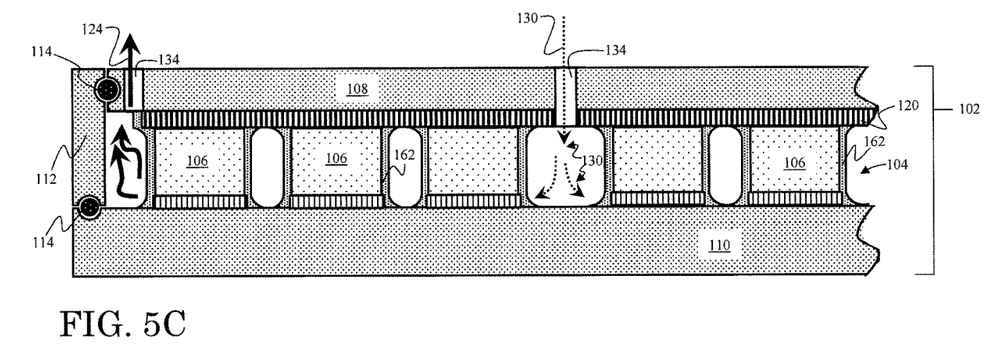
Figure 5D:
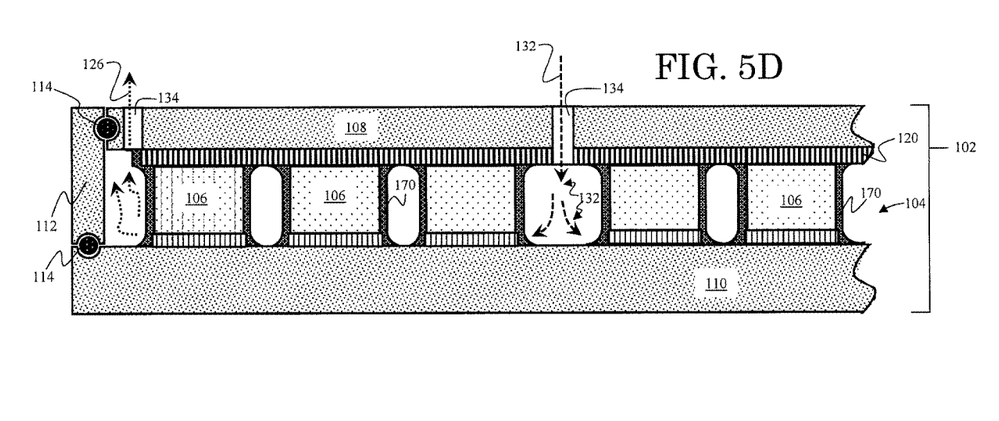
Figure 5E:
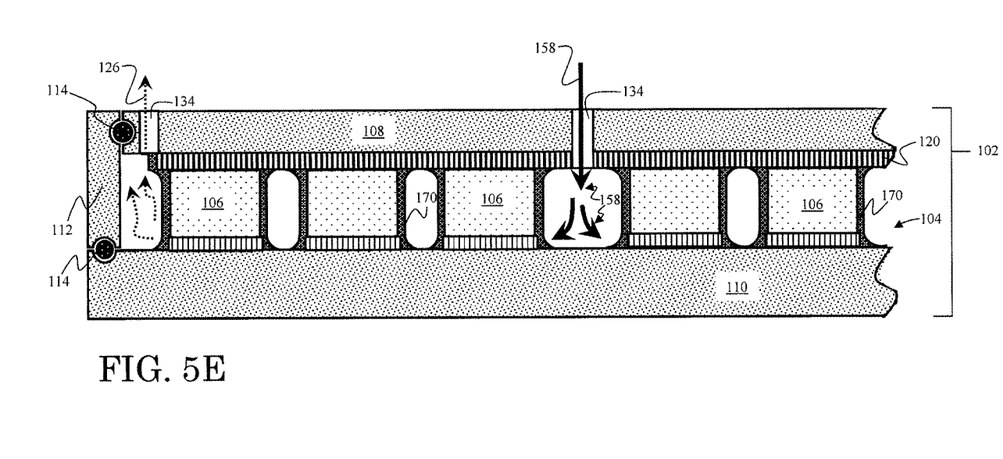
Figure 5F:
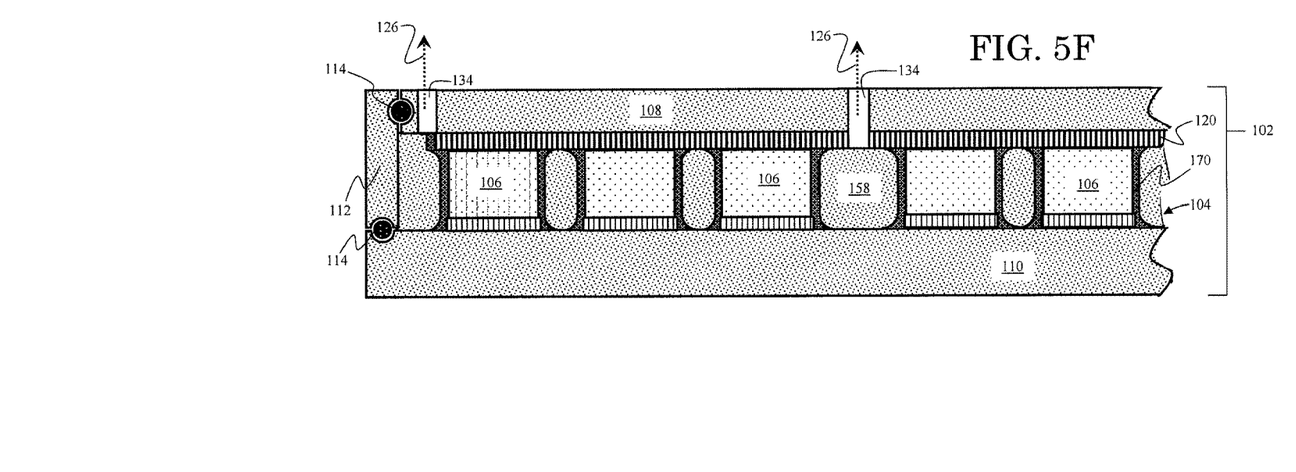
Figure 5G:
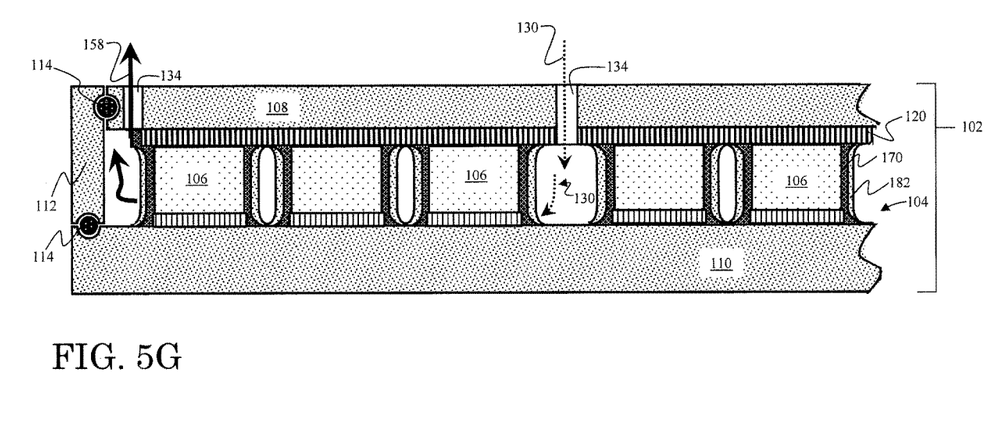
Figure 5H:
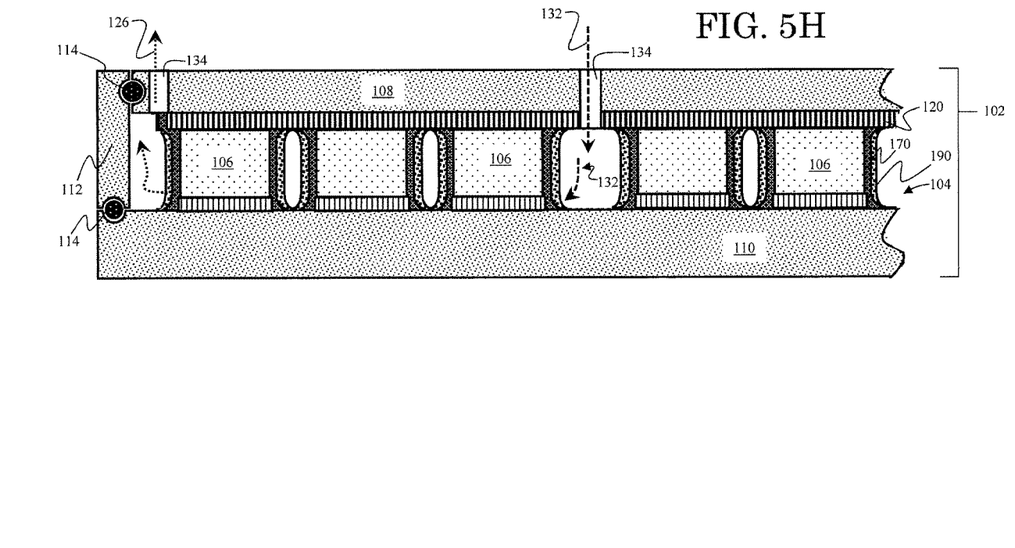
Figure 5I:
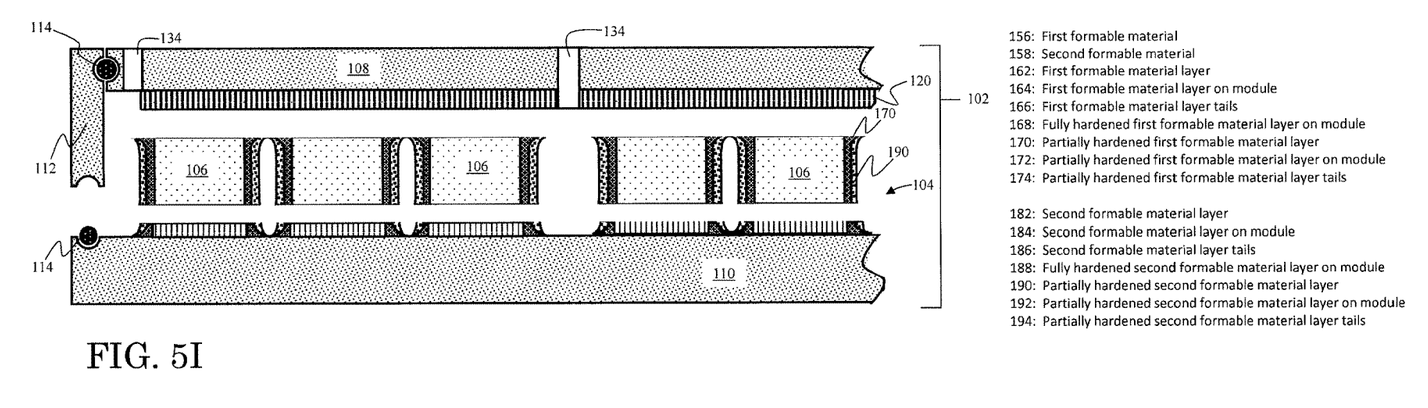
Figure 5J:
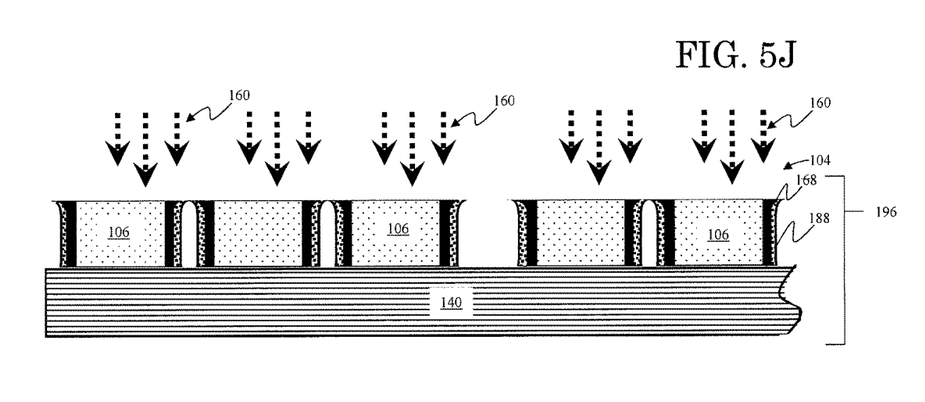

FIG. 1 depicts a wafer-level method for manufacturing uniform layers of material on one or more surfaces of a plurality of optoelectronic modules. At 1000, a wafer assembly 102 is assembled. The wafer assembly 102 can include a module wafer 104, a tool wafer 108, and a chuck 110. The module wafer 104 can include a plurality of optoelectronic modules 106. In some instances, the optoelectronic modules 106 can be modules that include a plurality of components (e.g., proximity sensors, digital cameras). In some instances, the optoelectronic modules 106 can be modules that include a few components or a single component (e.g., photodiode, laser diode, optical element, prism, lens stack, light-pipe).

The tool wafer 108, chuck 110, and module wafer 104 are configured to make a gas-tight seal around the plurality of optoelectronic modules 106, and to form gas-tight cavities 136 within the wafer assembly 102. Consequently, the tool wafer 108 and/or chuck 110 can further include a gas-tight mounting frame 112 and gaskets 114 (e.g., composed of rubber or silicone). Further, the tool wafer 108 and/or the chuck 110 can include one or more ports 134 through which a formable material 124 (or 156, 158), such as liquid epoxy in an uncured/unhardened state, can pass and further conduct into the plurality of cavities 136. Further, the one or more ports 134 can be configured to conduct a pressurized gas 130, and/or hot/reactive pressurized gas 132. Further the one or more ports 134 can be configured to apply a vacuum 126 to the wafer assembly 102.

The tool wafer 108 can be composed of polydimethylsiloxane (PDMS), glass, cured epoxy, stainless steel, or any other suitable material. In some instances, the tool wafer 108 can include a plurality of quick-release foils 116 (i.e., perforated layers of low-adhesion material, such as Teflon, PDMS, Mylar, or low-adhesion nano-structured materials), or a quick-release substrate 120 (i.e., a contiguous layer of low-adhesion material, such as Teflon, PDMS, Mylar, or low-adhesion nano-structured materials). In some instances, the tool wafer 108 can include a plurality of quick-release protrusions 118 formed into the tool wafer 108. In some instances, the tool wafer 108 can include transmissive portions 122 and non-transmissive portions 138 as further illustrated in FIG. 4A-FIG. 4D.

Similarly, the chuck 110 and be composed of polydimethylsiloxane (PDMS), glass, cured epoxy, stainless steel, or any other suitable material. In some instances, the chuck 110 can include a plurality of quick-release foils 116 (i.e., perforated layers of low-adhesion material, such as Teflon, PDMS, Mylar, or low-adhesion nano-structured materials), or a quick-release substrate 120 (i.e., a contiguous layer of low-adhesion material, such as Teflon, PDMS, Mylar, or low-adhesion nano-structured materials).

At 2000, the formable material 124 (or 156, 158) is injected into the plurality of cavities 136 within the wafer assembly 102 via the one or more ports 134. In some instances, the formable material 125 (or 156, 158) can be injected while applying a vacuum 126 to the wafer assembly 102, wherein the vacuum 126 can draw the formable material 124 (or 156, 158) into the plurality of cavities 136 such that gaps or air-pockets are not formed. In some instances, the formable material 124 (or 156, 158) can be injected while rotating 128 the wafer assembly 102 (e.g., at 1000-3000 revolutions/minute) such that the centripetal force applied to the formable material 124 (or 156, 158) draws the formable material into the plurality of cavities 136. In some instances, the formable material 124 (or 156, 158) can be injected while applying the vacuum 126 to the wafer assembly and rotating 128 the wafer assembly 102.

At 3000, excess formable material 124 (or 156, 158) is ejected from the wafer assembly 102. The formable material that remains in the wafer assembly 102 is a formable material layer 142 (or 162, 182). The formable material layer 142 (or 162, 182) can extend over one or more surfaces of the plurality of optoelectronic modules 106, and can further extend over surfaces of the chuck 110 and tool wafer 108. In some instances, the excess formable material 124 (or 156, 158) can be ejected while applying a vacuum 126 to the wafer assembly 102. In some instances, the excess formable material 124 (or 156, 158) can be ejected while rotating the wafer assembly 102 (e.g., at 1000-3000 revolutions/minute) such that the centripetal force applied to the excess formable material 124 (or 156, 158) draws the excess formable material out from the plurality of cavities 136. In some instances, the excess formable material can be ejected while applying pressurized gas 130 to the wafer assembly 102. In some instances, the excess formable material can be ejected while applying a vacuum 126 and/or pressurized gas 130 to the wafer assembly 102, and/or while rotating 128 the wafer assembly 102.

At 4000, the formable material layer 142 (or 162, 182) on the plurality of optoelectronic modules 106 is hardened/cured. In some instances, the formable material layer 142 (or 162, 182) on the plurality of optoelectronic modules 106 is hardened by applying a reactive pressurized gas (e.g., oxygen), a hot pressurized gas (e.g., 100-100° C.), and/or a hot and reactive pressurized gas to the module wafer. For example, in some instances, the formable material 124 (or 156, 158) can be hardened or cured in the presence of oxygen. In such instances, pressurized oxygen (i.e., the reactive pressurized gas) can be injected into the wafer assembly 102. The formable material remaining in the wafer assembly 102 (i.e. the formable material layer) can be partially or fully hardened or cured. In another example, the formable material can be hardened or cured when heated to a particular temperature. In such instances, hot inert pressurized gas can be injected into the wafer assembly. The formable material layer can be partially or fully hardened or cured.

In some instances, the formable material can be hardened or cured with radiation (e.g., infrared, or ultraviolet), and the plurality of optoelectronic modules can be transmissive to the radiation as further illustrated in FIG. 4A-FIG. 4D.

In some instances, the module wafer, including the formable material can be transferred to a hardening station where the formable material can be fully hardened or cured with radiation (e.g., infrared, or ultraviolet) as further illustrated in FIG. 2A-FIG. 2E.

At 5000, modules wafer with partially cured formable material can be transferred to a hardening station where the formable material can be fully hardened or cured with radiation (e.g., infrared, or ultraviolet) as further illustrated in FIG. 3-FIG. 5.

At 6000, the aforementioned steps can be repeated. In some instances, for example, multiple layers of formable material may be desired. This step is further illustrated in FIG. 5A-FIG. 5J.

FIG. 2 depicts an example wafer-level method for manufacturing uniform layers of material on one or more surfaces of a plurality of optoelectronic modules. FIG. 2A depicts formable material 124 being injected into the wafer assembly 102 via the port 134. A vacuum 126 is applied to the wafer assembly 102 via another port 134. Further, the wafer assembly 102 is rotated as depicted by the arrow 128. The wafer assembly 102 is further rotated as depicted in FIG. 2B such that the formable material 124 within the wafer assembly 102 is uniformly distributed within the wafer assembly 102. In addition, a vacuum 126 is applied to the ports 134 in this example, to de-gas the formable material 124. The wafer assembly 102 is further rotated as depicted in FIG. 2D. Moreover, a pressurized gas 130 is injected into the wafer assembly 102 via the port 134. Excess formable material 124 is ejected from another port 134 leaving a formable material layer 142 on one or more surfaces of the pluralities of optoelectronic modules 106 (i.e., formable material layer on module 144) and the surfaces of the tool wafer 108 and the chuck 110 (i.e., formable material layer tails 146). The tool wafer 108 and chuck 110 are separated from the module wafer 104 as depicted in FIG. 2D. Moreover, the quick-release foils 116 and the quick-release protrusions 118 permit the formable material layer 142 to be separated into the formable material layer on module 144 and formable material layer tails 146. The module wafer 104 is mounted to a hardening station substrate 140 (i.e., the hardening station assembly 196) and then the hardening station assembly 196 is brought to a hardening station and subjected to radiation 160 (e.g., UV, IR) as depicted in FIG. 2E such that the formable material layer on modules 144 is fully hardened/cured to the fully hardened material on modules 148.

FIG. 3 depicts another example wafer-level method for manufacturing uniform layers of material on one or more surfaces of a plurality of optoelectronic modules. FIG. 3A and FIG. 3B depict steps in an example process as described above and illustrated in FIG. 2A and FIG. 2B, respectively; however, the tool wafer 108 includes a quick-release substrate 120. FIG. 3C depicts a step in the example process as described above and illustrated in FIG. 2C. Following ejection of excess material 124, a hot, reactive, or hot and reactive pressurized gas 132 is injected via the port 134 into the module wafer 102. Moreover, a vacuum 126 is applied to another port 134 in this example. The hot, reactive, or hot and reactive pressurized gas 132 causes the formable material later 142 to partially harden, as depicted in FIG. 3D, into a partially hardened formable material layer on module 152 and a partially hardened formable material layer tails 154. The module wafer 104 is separated from the tool wafer 108 and the chuck 110, as depicted in FIG. 3E, and mounted to to the hardening station substrate 140 (i.e., the hardening station assembly 196). The hardening station assembly 196 is then brought to a hardening station and subjected to radiation 160 as described above.

FIG. 4 depicts still another example wafer-level method for manufacturing uniform layers of material on one or more surfaces of a plurality of optoelectronic modules. FIG. 4A depicts a step in an example process as described above and illustrated in FIG. 2A and FIG. 3A; however, the modules 106 are transmissive to radiation used to harden/cure the formable material 124 and the tool wafer 108 further includes transmissive portions 122 and non-transmissive portions 138. The transmissive portions 122 are also transmissive to the radiation used to harden/cure the formable material 124. FIG. 4B depicts another step in the example process as described above and illustrated in FIG. 2B and FIG. 3B; however, radiation is directed to the transmissive portions 122 of the tool wafer 108. The radiation is transmitted through the modules 106 to the formable material 124 such that the formable material 124 is partially hardened to the partially hardened formable material layer 152. FIG. 4C depicts another step in the example process. As above, excess formable material 124 is ejected from the wafer assembly 102 by pressurized gas 130. Moreover, the wafer assembly 102 is rotated such that, together with the pressurized gas 130, excess formable material 124 is ejected from the wafer assembly 102. The module wafer 104 is separated from the tool wafer 108 and the chuck 110 as depicted in FIG. 4D.

FIG. 5 depicts yet another example wafer-level method for manufacturing uniform layers of material on one or more surfaces of a plurality of optoelectronic modules. FIG. 5A-FIG. 5D depict steps in an example process as described above and illustrated in FIG. 3A-FIG. 3D, respectively. In another step, a second formable material 158 is injected into the wafer assembly 102 via the port 134 and a vacuum 126 is applied to the wafer assembly 102 via another port 134 as depicted in FIG. 5E. In another step, a vacuum 126 is applied to the ports 134 to de-gas the second formable material 158. In another step, pressurized gas 130 is injected into the wafer assembly 102 to eject excess second formable material as depicted in FIG. 5F. In another step, hot, reactive, or hot and reactive pressurized gas is injected into the wafer assembly 102 via the port 134. The hot, reactive, or hot and reactive pressurized gas partially hardens the second formable material 158 into a partially hardened second formable material layer 190. In another step, the module wafer is separated from the tool wafer 108 and the chuck 110 and mounted to a hardening station substrate 140 as depicted in FIG. 5I and FIG. 5J. The hardening station assembly 196 is then subjected to radiation as depicted din FIG. 5J as described above.

Other modifications may be made to the foregoing implementations, and features described above in different implementations may be combined in the same implementation. Thus, other implementations are within the scope of the claims.

What is claimed is:

1. A wafer-level method for manufacturing a uniform layer of material, the method comprising:
    assembling a wafer assembly, the wafer assembly including a chuck, a tool wafer, and a module wafer wherein the module wafer includes a plurality of optoelectronic modules;
    injecting a formable material into the wafer assembly, such that one or more surfaces of the plurality of optoelectronic modules are coated with a formable material layer;
    wherein injecting a formable material into the wafer assembly further includes rotating the wafer assembly;
    ejecting excess formable material from the wafer assembly; and
    hardening the formable material layer.

2. The wafer-level method of claim 1 wherein the wafer assembly includes a plurality of
    quick-release foils, a plurality of quick-release protrusions, a quick-release substrate, transmissive portions, or any combination of the aforementioned.

3. The wafer-level method of claim 2 wherein injecting a formable material into the wafer assembly further includes applying a vacuum to the wafer assembly.

4. The wafer-level method of claim 2 wherein injecting a formable material into the wafer assembly further includes applying a vacuum to the wafer assembly.

5. The wafer-level method of claim 2 wherein ejecting excess formable material from the wafer assembly includes applying a vacuum to the wafer assembly.

6. The wafer-level method of claim 2 wherein ejecting excess formable material from the wafer assembly includes rotating the wafer assembly.

7. The wafer-level method of claim 2 wherein ejecting excess formable material from the wafer assembly includes applying a pressurized gas to the wafer assembly.

8. The wafer-level method of claim 2 wherein ejecting excess formable material from the wafer assembly includes applying a vacuum and/or pressurized gas to the wafer assembly and/or rotating the wafer assembly.

9. The wafer-level method of claim 5 wherein hardening the formable material layer includes hardening the formable material with reactive pressurized gas, hot pressurized gas, reactive and hot pressurized gas, radiation, or any combination of the aforementioned.

10. The wafer-level method of claim 6 wherein hardening the formable material layer includes hardening the formable material with reactive pressurized gas, hot pressurized gas, reactive and hot pressurized gas, radiation, or any combination of the aforementioned.

11. The wafer-level method of claim 7 wherein hardening the formable material layer includes hardening the formable material with reactive pressurized gas, hot pressurized gas, reactive and hot pressurized gas, radiation, or any combination of the aforementioned.

12. The wafer-level method of claim 8 wherein hardening the formable material layer includes hardening the formable material with reactive pressurized gas, hot pressurized gas, reactive and hot pressurized gas, radiation, or any combination of the aforementioned.

13. The wafer-level method of claim 5 wherein hardening the formable material layer includes transferring the module wafer to a hardening station and subjecting the formable material layer to radiation and/or heat to harden the formable material layer.

* * * * *